United States Patent [19]

Brewer

[11] Patent Number: 4,503,450

[45] Date of Patent: Mar. 5, 1985

[54] ACCUMULATION MODE BULK CHANNEL CHARGE-COUPLED DEVICES

[75] Inventor: Robert J. Brewer, Lyndhurst, England

[73] Assignee: U.S. Philips Corporation, New York, N.Y.

[21] Appl. No.: 603,981

[22] Filed: Apr. 25, 1984

Related U.S. Application Data

[63] Continuation of Ser. No. 535,538, Sep. 23, 1983, abandoned, which is a continuation of Ser. No. 286,944, Jul. 27, 1981, abandoned, which is a continuation of Ser. No. 120,970, Feb. 13, 1980, abandoned.

[30] Foreign Application Priority Data

Feb. 19, 1979 [GB] United Kingdom ................. 7905716

[51] Int. Cl.$^3$ .................... H01L 29/78; H01L 27/14; H01L 31/00; G11C 19/28
[52] U.S. Cl. ........................................ 357/24; 357/30; 377/60; 377/63; 250/370
[58] Field of Search ................. 357/24 M, 24 LR, 30; 377/57–63; 250/338, 370; 307/311

[56] References Cited

U.S. PATENT DOCUMENTS

| | | | |
|---|---|---|---|
| 4,004,148 | 1/1977 | Howard et al. | 357/30 |
| 4,210,922 | 7/1980 | Shannon | 357/24 LR |
| 4,264,915 | 4/1981 | Bierhenke et al. | 357/24 M |
| 4,285,000 | 8/1981 | Deyhimy et al. | 357/24 M |

OTHER PUBLICATIONS

Nelson "Accumulation–Mode Charge–Coupled Device" Applied Physics Letters, vol. 25 (11/74) pp. 568–570.

*Primary Examiner*—Gene M. Munson
*Attorney, Agent, or Firm*—Robert T. Mayer; Steven R. Biren

[57] ABSTRACT

An accumulation-mode bulk channel CCD converts an electromagnetic radiation pattern into electrical signals. The device body may be of monocrystalline silicon and has a radiation-sensitive region which is of a first conductivity type determined by a dopant (e.g. sulphur, platinum, indium or thallium) having an energy level or levels sufficiently deep in the semiconductor band gap that substantially all of said dopant atoms are un-ionized at the device operating temperature. By this means the region is substantially free of majority charge carriers in the absence of radiation, and majority charge carriers trapped by the dopant atoms can be released upon excitation by the radiation. A first ohmic contact to the region supplies majority charge carriers to the dopant to replace charge carriers released by the incident radiation. An electrode system on a first major side of the region permits electric fields to be capacitively generated in the region for accumulating the released majority carriers below the electrode system as charge packets corresponding to the incident radiation pattern and for transporting these charge packets laterally across the region to an output from the region. The device is converted from a surface-channel to a bulk-channel CCD by the addition of a surface layer of the first conductivity type at the first major side of said region below the electrode system. The surface layer is separated from the first contact by the region and comprises a conductivity-type determining dopant (e.g. arsenic) having an energy level or levels sufficiently shallow in the semiconductor band gap such that at the operating temperature atoms of this shallow-level dopant are ionized. An ohmic contact which may also serve as the output is electrically connected to the surface layer for extracting the majority charge carriers generated by the shallow-level dopant and thereby forming in the surface layer a space-charge zone which forms in the body a potential minimum spaced from the surface.

5 Claims, 2 Drawing Figures

ACCUMULATION MODE BULK CHANNEL CHARGE-COUPLED DEVICES

This is a continuation of application Ser. No. 535,538, filed Sept. 23, 1983, now abandoned, which is a continuation of application Ser. No. 286,944, filed 7/27/81, now abandoned, which is in turn a continuation of application Ser. No. 120,970, filed 2/13/80, also now abandoned.

BACKGROUND OF THE INVENTION

This invention relates to accumulation-mode charge-coupled devices for converting into electrical signals an electromagnetic radiation pattern in a certain wavelength range, particularly but not exclusively for detecting and imaging infra-red radiation.

An accumulation-mode charge-coupled device for converting an infra-red radiation pattern into electrical signals is described in pages 568–570 of Applied Physics Letters, Vol. 25, No. 10, Nov. 15, 1974. The device comprises a semiconductor body having a radiation-sensitive region which is of one conductivity type determined by dopant having an energy level (or levels) sufficiently deep in the semiconductor band gap that substantially all of the atoms of said dopant are un-ionized at the temperature of operation of the device for detecting the infra-red radiation, whereby the said region is substantially free of majority charge carriers in the absence of said radiation and majority charge carriers trapped by said dopant atoms can be released upon excitation by incident infra-red radiation. An ohmic contact to said region is present for supplying to said dopant majority charge carriers to replace charge carriers released by the incident radiation. An electrode system is present on one major side of the region for permitting electric fields to be capacitively generated in the region for accumulating the released majority carriers below the electrode system as charge packets corresponding to the incident radiation pattern and for transporting said charge packets laterally across the region to an output from the region.

The temperature of operation of this known device is 4° K., and phosphorus can be used as the region dopant at this temperature. At room temperature substantially all phosphorus dopant atoms would be ionized and so phosphorus is generally regarded as a shallow-level dopant; however, at 4° K. substantially all of the phosphorus dopant atoms are un-ionized so that at this very low temperature phosphorus is a deep-level dopant. Because substantially all of its dopant atoms are un-ionized, the said region is both substantially free of majority charge-carriers and electrically neutral at the device operating temperature in the absence of the incident radiation. The need to use an operating temperature as low as 4° K. for this known device can be a disadvantage.

The accumulation-mode device described in Applied Physics Letters is an unconventional surface-channel charge-coupled device. It is compared therein with an inversion-mode device arrangement such as occurs in conventional surface-channel charge-coupled devices. In inversion-mode devices charge transfer is of minority carriers, whereas in the accumulation-mode device the charge transfer is of majority carriers (electrons in the phosphorus-doped region). In the accumulation-mode device described the energy bands in the semiconductor region have a linear spatial dependence in the direction of thickness of the region because there is no immobile space charge in this device; thus the electric field is constant throughout the region thickness from the one major side to the opposite major side (neglecting fringing fields between neighboring gates of the electrode system on the one major side). The electric field at an accumulated semiconductor surface is smaller than at an inverted surface because the surface potential in the former case appears across the whole thickness of the region. Thus the charge-packets transferred in the known accumulation device are not so confined against the surface as in an inversion-mode device, and this should reduce the effect of surface trapping states and hence aid transfer efficiency. However, the charge-packets still adjoin the surface during transfer through the region of this known accumulation-mode charge-coupled device so that surface states serving as traps or recombination centers for the charge carriers can adversely affect the charge transfer efficiency, the charge transfer noise, and the speed of operation.

SUMMARY OF THE INVENTION

According to the present invention an accumulation-mode charge-coupled device for converting into electrical signals an electromagnetic radiation pattern in a certain wavelength range, comprising a semiconductor body having a radiation-sensitive region which is of one conductivity type determined by dopant having an energy level or levels sufficiently deep in the semiconductor band gap that substantially all of the atoms of said dopant are un-ionized at the temperature of operation of the device for detecting radiation in the said wavelength range, whereby the said region is substantially free of majority charge carriers in the absence of said radiation and majority charge carriers trapped by said dopant atoms can be released upon excitation by incident radiation in the said wavelength range, a first ohmic contact to said region for supplying to said dopant majority charge carriers to replace charge carriers released by the incident radiation, and an electrode system on one major side of the region for permitting electric fields to be capacitively generated in the region for accumulating the released majority carriers below the electrode system as charge packets corresponding to the incident radiation pattern and for transporting said charge packets laterally across the region to an output from the region, is characterized in that at the said one major side of said region below the electrode system there is present a surface layer of said one conductivity type which comprises conductivity-type determining dopant having an energy level or levels sufficiently shallow in the semiconductor band gap that at the temperature of operation of the device atoms of this shallow-level dopant are ionized, in that said surface layer adjoins said region and is separated from the first ohmic contact by a part of region, and in that a second ohmic contact is electrically connected to said surface layer for extracting the majority charge carriers generated by the shallow-level dopant and thereby forming in said surface layer a space-charge zone which forms in the body a potential minimum spaced from the surface so as to permit the said charge packets to be accumulated and transported at a distance below the surface of the body.

This inclusion of such a surface layer in the accumulation-mode charge-coupled device converts the device from a surface-channel charge-coupled device to a bulk-channel charge-coupled device and so can improve the charge transfer efficiency and speed of operation and reduce the charge transfer noise. However unlike a conventional bulk-channel charge-coupled device such as that described in, for example, published U.K. Patent Specification (GB-PS) No. 1,414,183, substantially all of the atoms of the conductivity-type determining dopant in the said region are un-ionized so that the depletion zone and its associated space-charge zone are restricted to the said surface layer. Therefore said region remains substantially electrically neutral in the absence of the incident radiation. Even when the radiation is incident, said region remains substantially electrically neutral because the first ohmic contact supplies to the excited dopant atoms majority carriers to replace those released by the incident radiation. Compared with a conventional bulk-channel CCD this absence of ionized dopant in said region can permit the use of lower operating voltages and reduce the incidence of ionized dopant sites retrapping majority carriers released by the incident radiation. A further prior-art bulk channel charge transfer device is shown in U.S. Pat. No. 4,012,759.

Generally the temperature of operation of the device is considerably greater than 4° K., because at the operating temperature sufficient atoms of the shallow-level dopant must be ionized to form the potential minimum for the majority charge carriers. It will generally be necessary to cool the semiconductor body, the extent of cooling required depending on the nature of the deep-level dopant which determines the conductivity type of the said radiation-sensitive region. At the operating temperature substantially all of the atoms of this deep-level dopant must be un-ionized. It is desirable for optimum operation of the device that the rate of thermal excitation of the deep-level dopant is appreciably less than the rate of excitation by the incident radiation in the said wavelength range. The radiation absorption edge is determined by the ionization energy of the dopant levels.

Thus, for a silicon device imaging infra-red radiation in the 3 micron to 5 micron band, cooling to 77° K. should give acceptable operation when using p-type material with thallium as its deep-level acceptor dopant. If indium is used instead of thallium a temperature of about 60° K. may be used. Cooling to, for example, 30° K. may be required for satisfactory operation of a silicon device in the waveband range of 8 microns to 14 microns.

Because the deep-level dopant determines the conductivity type of the whole of the said radiation-sensitive region it is advantageous to form the region using a fast diffusing dopant such as sulphur or platinum; both these dopants are donors in silicon and can be used for detecting infra-red radiation in the waveband ranges 3 to 6 microns and 3 to 4 microns respectively at operating temperatures of 70° K. and 90° K. respectively.

Thus there are various dopants which may be used depending on the semiconductor material and the wavelength range of the radiation. However, the device response will be confined to a wavelength range corresponding to energy values less than the energy band gap of the semiconductor material.

Although the formation of devices for imaging infra-red radiation is an important application, this invention may also be used with devices designed to operate at other wavelengths. The incident radiation may enter the radiation-sensitive region either from the said one major side or from the opposite major side, depending on the device type.

It is advantageous to use silicon as the semiconductor material of the device body because silicon technology is well developed, being used for the manufacture of most semiconductor devices including conventional charge-coupled devices. However other semiconductor materials may be used for devices in accordance with the invention, for example gallium arsenide, and when using wider band gap semiconductors it may be possible to operate the device at room temperature so that the provision of cooling means is unnecessary.

The said surface layer may be formed by doping with a shallow-level dopant the surface of the material providing said radiation-sensitive region, for example by dopant diffusion or implantation. In this case the surface layer also contains the deep-level dopant. However the surface layer may alternatively be formed by semiconductor deposition on the said region, and in this latter case it need not contain deep-level dopant. In order to increase the charge handling capability of the charge-coupled device it is preferable for the surface layer to be as shallow as possible. For this reason, if high temperatures are used in or after the formation of the surface layer, the shallow-level dopant in the surface layer is preferably a slow diffuser, for example arsenic.

Two second ohmic contacts may be electrically connected to said surface layer for extracting said majority charge carriers. Thus, for example, there may be one second contact adjacent the said output from the region and the other second contact at the opposite end of the surface layer.

The said second ohmic contact (or one of the second ohmic contacts) may also be associated with the output from the region for extracting the transported charge packets. This can result in a compact structure. An output signal corresponding to a charge packet may be derived in many ways, for example using a floating gate. However a particularly compact structure is obtained when charge-package detection means are connected to the said second ohmic contact (or one of the second ohmic contacts) so that this ohmic contact also serves as the signal output.

The first ohmic contact to the radiation-sensitive region may extend on the one major side of the region so as to contact part of said region alongside the charge-transfer channel. However, such an arrangement can complicate the layout of the electrode system at said one major side. Therefore in order to avoid such a complication the first ohmic contact is preferably present at the opposite major side of said region, for example as a diffused surface layer and/or metallization over the back of the semiconductor body.

The electrode system at the one major side may consist of insulated gates which are present on one or more insulating layers at the semiconductor body surface and which are interconnected in a conventional multi-phase CCD electrode arrangement. However, the term "electrode system" should be understood to have a very wide meaning; thus, not only are such multi-phase insulated-gate arrangements included but also less conventional systems for capacitively generating the electric fields in the region; examples of less conventional systems are single-phase arrangements employing a drift-field produced in the region by a varying thickness or charge-state of the insulating layer(s) or by a potential difference along a resistive electrode, and arrangements where the barrier layer separating electrode or electrodes from the semiconductor body surface is a rectifying junction instead of an insulating layer.

The said electrode system may be organized and arranged to define a linear array of charge-accumulation sites for detecting the incident radiation. However an imaging device in accordance with the invention may be of more complex configuration. Thus, a so-called area imaging device may be formed and various means of reading the charge as used in conventional imaging CCD's may be used, for example a device may additionally comprise a masked array of elements corresponding in number to the elements used in the imaging part of the device, the masked array being connected to the imaging array and serving as a store which is read-out through a series-parallel CCD conversion stage.

BRIEF DESCRIPTION OF THE DRAWING

An embodiment of the invention will now be described, by way of example, with reference to the accompanying diagrammatic drawing, in which.

DETAILED DESCRIPTION

Figure 1:
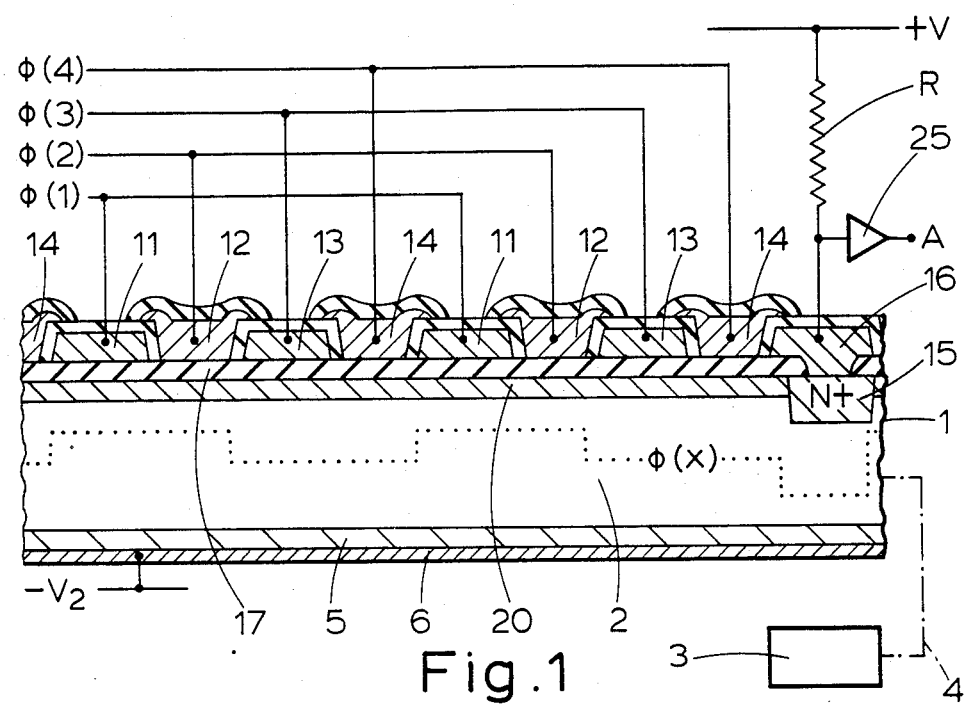
FIG. 1 is a cross-sectional view of part of a charge-coupled device in accordance with the invention.
Figure 2:
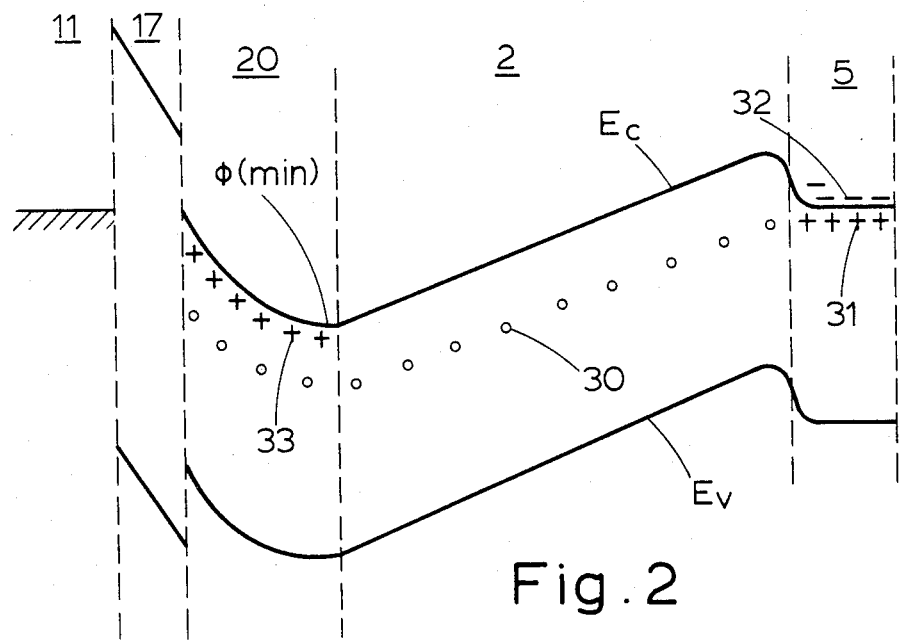
FIG. 2 is an energy band diagram across the thickness of the device of FIG. 1.

It should be noted that FIGS. 1 and 2 are not drawn to scale, and the relative dimensions and proportions of some parts of these Figures have been shown exaggerated or reduced for the sake of clarity and convenience.

The charge-coupled device illustrated in FIG. 1 is an accumulation-mode imaging device for converting an infra-red radiation pattern into electrical signals. The device comprises a monocrystalline silicon semiconductor body 1 having a radiation-sensitive region 2. The region 2 is of one conductivity type determined by dopant having an energy level or levels sufficiently deep in the semiconductor band gap that substantially all of the atoms of said dopant are un-ionized at the temperature of operation of the device for detecting the infra-red radiation. These energy levels are illustrated by circles 30 in FIG. 2, where the band gap is illustrated by $E_c$ for the conduction band edge and $E_v$ for the valence band edge.

In this example cooling means diagrammatically shown as block 3 are present for maintaining the device at a temperature which provides inadequate thermal energy to ionize the dopant atoms. The cooling means 3 may be any known type of cryostat cooler with a dewar envelope and having a heat removal path to the device body 1 for permitting the device to be operated in a cryogenic environment. In FIG. 1, the heat removal path is symbolized by the chain dot line 4. The conductivity-type determining dopant of the region 2 may be sulphur which yields donor states in silicon with an energy level approximately 0.18 eV from the conduction band edge $E_c$. The device of FIG. 1 with the sulphur dopant may be operated at, for example, 70° K. for the detection and imaging of infra-red radiation in the wavelength band of between 3 and 6 microns. At this temperature substantially all of the sulphur dopant atoms are un-ionized so that the region 2 is substantially free of majority charge carriers (electrons) in the absence of the infra-red radiation. The electrons trapped by the sulphur dopant atoms can be released upon excitation by the incident infra-red radiation.

A first ohmic contact 5,6 to the region 2 is present for continuously supplying electrons to the sulphur dopant atoms of region 2 to replace electrons released by the incident radiation. In the example shown in FIG. 1, this contact 5,6 extends over the whole of the bottom surface of the body 1 and comprises a highly-doped n-type surface layer 5 (N+) and a metal electrode layer 6. The layer 5 contains a shallow-level donor, for example phosphorus, substantially all the atoms of which are ionized at the device operating temperature; these shallow-level donors are illustrated by "plus" symbols 31 in FIG. 2, and the donated electrons are illustrated by "minus" symbols 32 above the conduction band edge $E_c$. The layer 5 forms a good low resistance contact between the metal electrode layer 6 and the radiation-sensitive region 2. The layer 6 may be of, for example, aluminium and may be at a negative potential $(-V_2)$, for example $-15$ volts. The device may however be used with the layer 6 at, for example, earth potential, and different voltages applied to the other electrodes.

An electrode system 11, 12, 13 and 14 is present on one major side of the region 2 (i.e. the opposite side to the contact 5,6) for permitting electric fields to be capacitively generated in the region 2. In a known manner, this permits the electrons released in the region 2 by the incident radiation to be accumulated below the electrode system 11, 12, 13 and 14 as charge packets corresponding to the incident radiation pattern, and also permits these charge packets to be transported laterally across the region 2 to an output 15,16 from the region 2.

In this example the electrode system is a multi-phase insulated-gate CCD arrangement in which the charge accumulation and transport is effected by applying clock pulses $\phi(1)$, $\phi(2)$, $\phi(3)$ and $\phi(4)$ of, for example, $\pm 5$ volts to the gates 11, 12, 13 and 14 respectively. The electric fields produced in the region 2 by these potentials $\phi(1)$, $\phi(2)$, $\phi(3)$ and $\phi(4)$ are capacitively generated in this example across an insulating layer 17 between the semiconductor body 1 and the gates 11 to 14. The dotted line $\phi(x)$ shown in FIG. 1 illustrates the resulting potential distribution laterally across the charge-transfer region along the line of potential minimum for electrons, for the situation where the gate potentials $\phi(1)$ to $\phi(4)$ are such that a charge packet (of electrons) under the last gates 13 and 14 of the CCD line is transferred to the output 15, 16. For this purpose a positive potential $(+V_1)$, for example $+15$ volts, is connected to the output 15, 16. It should be noted that in the potential distribution $\phi(x)$ as illustrated in FIG. 1 the lower levels correspond to more positive potentials.

The output 15,16 from the region 2 shown in this example comprises a highly-doped n-type surface zone 15 (N+) and an electrode 16 which may be of, for example, metal or conductive polycrystalline silicon. The zone 15 contains a shallow-level donor, for example phosphorus, substantially all the atoms of which are ionized at the device operating temperature thereby forming a good low-resistance contact between the electrode 16 and the region 2.

The radiation pattern to be detected may enter the region 2 through either the top or bottom surface of the body 1, depending on the nature and thickness of the materials chosen for the insulated electrode system 11, 12, 13 and 14, and its insulating layer 17 and the materials chosen for the electrode layer 6 and the mount on which the body 1 is provided. The photo-sensitive region 2 functions similar to an extrinsic photoconductor between the first and second ohmic contacts 5, 6 and 15,16. The back contact 5,6 serves to maintain the current flow to the front surface when the region 2 is illuminated by the infra-red radiation.

The device of FIG. 1 is not a surface-channel CCD but a bulk-channel device. The charge-packets are accumulated and transported at a distance below the surface of the body as a result of the inclusion of a semiconductor surface layer 20 at the major side of the region 2 below the electrode system 11 to 14. This surface layer 20 is of the same conductivity type as the region 2 but containing conductivity-type determining dopant having an energy level or levels sufficiently shallow in the semiconductor band gap that atoms of this shallow-level dopant are ionized at the temperature of operation of the device. This shallow-level dopant is illustrated by "plus" symbols 33 in FIG. 2. In this example where the conductivity type is n-type this shallow-level dopant may be phosphorus, but preferably it is a donor having a smaller diffusion coefficient, for example arsenic. The donor energy levels of both phosphorus and arsenic are within 0.05 eV of the conduction band edge so that substantially all of the atoms of this shallow-level dopant will be ionized at the operating temperature. The surface layer 20 adjoins said region 2 and is separated from the first ohmic contact 5,6 by a part of the region 2 not containing shallow-level dopant of the same conductivity type as the region 2. This separation is important for avoiding a short-circuit connection between the first and second ohmic contacts 5,6 and 15,16 respectively. In the FIG. 1 device it is the whole thickness of the region 2 which separates the surface layer 20 (and its contact 15,16) from the contact 5,6 to the region 2.

The positively-biased output 15,16 also acts as an ohmic contact electrically connected to this surface layer 20 for extracting the majority charge carriers (in this case, electrons) generated by the shallow-level dopant in the layer 20. This depletes the layer 20 of the free electrons, and so the ionized dopant atoms produce in the layer 20 a positive space-charge zone. As a result of this space-charge zone, the layer 20 serves to bend the energy bands in the body 1 and form a potential minimum $\phi(min)$ for electrons at a distance below the body surface, thus forming the bulk-channel. This potential minimum $\phi(min)$ is illustrated in FIG. 2. In the arrangement of FIGS. 1 and 2, $\phi(min)$ is actually a positive potential, the potential level in contact layer 5 corresponds to $-V_2$, and the potential of the gate electrode 11 is increased and decreased in accordance with the clock pulses $\phi(1)$. In FIG. 2, the lines in electrode 11 and layer 17 represent respectively the Fermi level in the metal and the energy gap of the insulator.

In the arrangement of FIG. 1, the output 15,16 which provides the second ohmic contact to the surface layer 20 also serves as a signal output. For that purpose, charge-packet detection means are connected to the contact 15,16. In the example shown these detection means comprise a resistor R across which a potential difference is developed, the magnitude of which depends on the amount of charge transferred in a packet to the region 15. The output signal is derived at A, via an amplifier 25. The charge-packet detection means may be integrated on the device body 1. The n-type surface layer 20 may be laterally surrounded by, for example, a p-type isolation grid which is connected to $-V_2$ to laterally confine the charge transfer and so to laterally isolate the CCD channel from components integrated in other areas of the body 1.

The device of FIG. 1 can be manufactured using known technology. The starting material may be a silicon wafer of very lowly-doped p-type material, e.g. having a boron doping of $10^{14}$ atoms/cm$^3$. The region 2 may then be formed by diffusing sulphur throughout the thickness of the wafer to provide a sulphur doping concentration f for example $10^{16}$ atoms/cm$^3$. It should be noted that the compensated boron doping concentration in the region 2 does not affect the electrical neutrality of region 2 and does not give rise to free minority carriers (in this case, holes) in the region 2.

The contact zones 5 and 15 may be provided by phosphorus diffusion to have a high surface concentration, e.g. $10^{19}$ phosphorus atoms/cm$^3$ for providing a low resistance contact. In some devices it may be sufficient to provide the electrode 16 directly on the surface layer 20, thus omitting the provision of a separate contact zone 15.

The surface layer 20 may be provided by ion implantation so as to obtain a precise control of the number of shallow-level dopant atoms therein. The extent of the band bending is determined by this number of ionized dopant atoms in the depleted layer 20. A dose of between $1 \times 10^{12}$ and $2 \times 10^{12}$ arsenic ions/cm$^2$ may be implanted at an energy (e.g. of 50 keV) sufficient to form a layer 20 having a depth of e.g. 0.2 micron from the wafer surface. This gives an average doping concentration of between $5 \times 10^{16}$ and $10^{17}$ arsenic atoms/cm$^3$ for the layer 20. Preferably the arsenic dose should be as high as possible to prevent the largest charge packets produced in the device from reaching the body surface; thus, in general a charge packet does not extend to the body surface if its charge/cm$^2$ is less than the arsenic dose. However the does must be less than approximately 2 to $4 \times 10^{12}$/cm$^2$ for a silicon device since otherwise the positive space-charge formed by its depletion will result in avalanche breakdown of the silicon material.

The insulating layer 17 and electrode system 11 to 14 may be formed in known manner. A typical thickness for the layer 17 is between 0.1 and 0.2 microns of silicon dioxide.

I claim:

1. An accumulation-mode bulk channel charge-coupled device for continuously converting an electromagnetic radiation pattern in a certain wavelength range into an electrical signal, which comprises:
    a semiconductor body having a radiation-sensitive region for detecting radiation in said wavelength range of a first conductivity type determined by a dopant having at least one energy level sufficiently deep in the semiconductor band gap such that substantially all of the atoms of said dopant are un-ionized at the temperature of operation of the device, substantially all first-conductivity-type impurities present in said region being un-ionized at said temperature, said region being subtantially free of majority charge carriers in the absence of said radiation and majority charge carriers trapped by said dopant atoms being released upon excitation by incident radiation in said wavelength range;
    a first ohmic contact to said region for supplying majority charge carriers to said dopant to replace charge carriers released by the incident radiation;
    an electrode system adjacent a first major side of the region for permitting electric fields to be capacitively generated in the region for accumulating the released majority carriers below the electrode system as charge packets corresponding to the incident radiation pattern and for transporting said charge packets laterally across the region to an output connection from the region;

a surface layer of said first conductivity type at said first major side of said region below the electrode system which comprises a conductivity-type-determining dopant having at least one energy level sufficiently shallow in the semiconductor band gap such that at the temperature of operation of the device atoms of this shallow-level dopant are ionized, said surface layer adjoining said region and being separated from the first ohmic contact by a part of said region; and a second ohmic contact which is electrically connected to said surface layer for extracting the majority charge carriers generated by the shallow-level dopant to form a space-charge zone in said surface layer which forms a potential minimum in said body which is spaced from the surface so as to permit said charge packets to be accumulated and transported at a distance below the surface of the body.

2. A device as claimed in claim 1, in which the second ohmic contact also serves as the output from the region for extracting the transported charge packets.

3. A device as claimed in claim 1 or claim 2, in which the semiconductor body is of silicon, and the shallow-level dopant in the surface layer is arsenic.

4. A device as claimed in claim 1 or claim 2, in which the semiconductor body is of silicon, and the conductivity-type determining dopant of said region is selected from the group of dopants consisting of sulphur and platinum.

5. A device as claimed in claim 1 or claim 2, in which the first ohmic contact is located at a second major side of said region opposite the first and is separated from said surface layer by the thickness of said region.

* * * * *